United States Patent
Ito

(10) Patent No.: US 6,376,155 B2
(45) Date of Patent: *Apr. 23, 2002

(54) PATTERNING METHOD IN SEMICONDUCTOR DEVICE FABRICATING PROCESS

(75) Inventor: Katsuyuki Ito, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/317,855

(22) Filed: May 25, 1999

(30) Foreign Application Priority Data

May 25, 1998 (JP) ............................................ 10-142970

(51) Int. Cl.⁷ .............................. G03F 7/26; G03F 7/38; H01L 21/27; H01L 21/306
(52) U.S. Cl. ...................... 430/313; 430/314; 430/317; 438/94; 438/748
(58) Field of Search ................................. 430/313, 314, 430/316, 317; 438/FOR 100, 94, 748

(56) References Cited

U.S. PATENT DOCUMENTS 6,242,160 B1 * 6/2001 Fukuzawa et al. .......... 430/313

FOREIGN PATENT DOCUMENTS

| EP | 0 195 315 | 3/1986 |
| GB | 1096507 | 6/1966 |
| GB | 1 225 754 | 6/1967 |
| GB | 1 422 698 | 4/1973 |
| GB | 2 221 767 A | 2/1990 |
| JP | 2-156244 | 6/1990 |
| JP | 5-181281 | 7/1993 |
| JP | 6-5565 * | 1/1994 |
| JP | 6-214402 | 8/1994 |
| JP | 07-120934 | 5/1995 |
| JP | 8-83763 | 3/1996 |
| WO | WO 87/03387 | 6/1987 |

OTHER PUBLICATIONS

English abstract of JP 6–5565, 1994.*

* cited by examiner

Primary Examiner—Shean C. Wu
(74) Attorney, Agent, or Firm—McGinn & Gibb, PLLC

(57) ABSTRACT

In a semiconductor device fabricating process, a chemical amplification resist layer is formed on an insulating film formed on a semiconductor substrate, and the chemical amplification resist layer is patterned to form an opening. The insulating film formed on the semiconductor substrate is wet-etched using the patterned chemical amplification resist layer as a mask. Before the wet-etching is carried out, a surface treatment is conducted for the patterned chemical amplification resist layer to form an insoluble layer at a surface of the patterned chemical amplification resist layer, thereby to elevate a wet-etching-resistance of the patterned chemical amplification resist layer. Thus, deformation of a resist pattern formed of the patterned chemical amplification resist layer is prevented in the wet etching process, so that an opening pattern of a desired shape is formed in the insulating film.

19 Claims, 3 Drawing Sheets

US 6,376,155 B2

PATTERNING METHOD IN SEMICONDUCTOR DEVICE FABRICATING PROCESS

BACKGROUND OF THE INVENTION

1. Field of the Invention

The present invention relates to a patterning method in a semiconductor device fabricating process, and more specifically to a method for patterning a film on a semiconductor substrate by a wet etching.

2. Description of Related Art

In a semiconductor device fabricating process, a Novorak resin is conventionally used in a step for forming in an insulating film a contact hole for interconnecting an upper level conducting film and a lower level conducting film. However, in order to realize a high throughput and a high level of microfabrication, it is necessary to use a chemical amplification resist in patterning the insulating film.

One example of the patterning method using the chemical amplification resist is disclosed in Japanese Patent Application Pre-examination Publication No. JP-A-07-120934 (an English abstract of JP-A-07-120934 is available and the content of the English abstract is incorporated by reference in its entirety into this application). This prior art example proposes a chemical amplification resist developing method for preventing a so-called "T top" which is generated at the time of patterning a conductor by using a positive photoresist. It was discovered that a cause for generation of the "T top" is a hard-dissolving layer formed on a surface of a selectively exposed positive chemical amplification resist layer. When the selectively exposed positive chemical amplification resist layer is developed, first, the development is carried out by using a first developing solution including an activator for elevating affinity to the chemical amplification resist material, until the hard-dissolving layer is dissolved, and thereafter, the development is continued by using a second developing solution including no activator and therefore having a highly selective dissolving property until the development is completed. Thus, the positive chemical amplification resist pattern having a desired shape can be formed. If an underlying conductor layer (a material layer to be etched) is patterned by using the positive chemical amplification resist pattern thus formed, there is obtained a conductor layer patterned to have a desired line width with no difference between the line width of the positive chemical amplification resist pattern (width of "T top") and the line width of an actually etched conductor layer, namely with no so-called conversion difference.

However, when an interconnecting contact hole is formed in an insulating film, which is different from the case of patterning the conductor, It was found out that the following problem has been encountered. If the lithography using the chemical amplification resist is carried out without modifying a process which was carried out using the Novorak resist in the prior art, the shape of an opening formed in the chemical amplification resist layer has deformed before a step of forming a metal film on a patterned insulating film by means of a CVD (chemical vapor deposition) process or a sputtering. As a result, a desired contact hole could not formed in the insulating film. Under this condition, a metal film cannot be formed in the inside of the contact hole as desired, with the result that a satisfactory electrical interconnection cannot be obtained between an upper level conducting layer and a lower level conducting layer.

A cause for the deformation of the chemical amplification resist layer is considered to be that the insulating film is wet-etched using the chemical amplification resist layer as a mask. As described in detail in Paragraph Nos. 0006 and 0007 of the above referred JP-A-07-120934, the chemical amplification resist is a high-resolution, high-sensitivity resist utilizing a catalytic reaction of acid generated in a portion selectively exposed by an exposure light source, and on the other hand, a wet etching liquid used for patterning the insulating film is a strong acid. Therefore, if the chemical amplification resist is brought into contact with the wet etching liquid, the acid catalytic reaction is easy to occur at a contact surface. As a result, the opening pattern formed in the chemical amplification resist layer by the lithography step becomes deformed in the wet etching step succeeding to the lithography step.

In particular, in the case that an insulating layer is formed in two layers for planarization and an upper level insulating film is wet-etched and succeedingly a lower level insulating film is dry-etched, when a baking is conducted after the wet-etching, diffusion of acid is promoted by a heat of the baking, so that a heavy deformation of the pattern occurs, with the result that the opening formed in the chemical amplification resist layer is often filled up. In this condition, a contact hole is not formed in the lower level insulating film of the double-layer insulating film, so that the upper level conducting film and the lower level conducting film cannot be interconnected.

SUMMARY OF THE INVENTION

Accordingly, it is an object of the present invention to provide a patterning method using a chemical amplification resist as a mask, which has overcome the above mentioned defect of the prior art semiconductor device fabricating process.

According to the present invention, in a semiconductor device fabricating process, there is provided a patterning method including the steps of forming a chemical amplification resist layer on a film formed on a semiconductor substrate, patterning the chemical amplification resist layer, and wet-etching the film formed on the semiconductor substrate using the patterned chemical amplification resist layer as a mask, wherein before the wet-etching is carried out, a surface treatment is conducted for the patterned chemical amplification resist layer to elevate a wet-etching-resistance of the patterned chemical amplification resist layer.

The surface treatment for elevating the wet-etching-resistance of the patterned chemical amplification resist layer is, for example, to form, on a surface of the patterned chemical amplification resist layer, a protection film which is insoluble or hard-dissolving to a wet etching liquid, or to treat a surface of the patterned chemical amplification resist layer with a strong alkali liquid, or to expose a surface of the patterned chemical amplification resist layer to plasma, or to irradiate, onto a surface of the patterned chemical amplification resist layer, a radiation different from a radiation of an exposure radiation source used for patterning the chemical amplification resist layer.

As mentioned above, when an insulating film formed on a semiconductor substrate is wet-etched using a patterned chemical amplification resist layer as a mask, after a protecting film insoluble or hard-dissolving to a wet-etching liquid is previously formed at a surface of the patterned chemical amplification resist layer, to elevate a wet-etching-resistance of the patterned chemical amplification resist layer, the wet-etching is actually carried out. Thus, the above mentioned pattern deformation of the patterned chemical amplification resist layer caused by the wet etching is prevented so that an opening pattern of a desired shape is formed in the insulating film formed on the semiconductor substrate. Here, "insoluble to a wet-etching liquid" means a nature which is almost never dissolved by the wet-etching liquid, and "hard-dissolving to a wet-etching liquid" means a nature which is difficult to be dissolved by the wet-etching liquid. In the present invention, it is sufficient if the protecting film is not completely dissolved during a period of time in which the wet etching is carried out, since the chemical amplification resist layer is protected from the wet etching liquid.

The above and other objects, features and advantages of the present invention will be apparent from the following description of preferred embodiments of the invention with reference to the accompanying drawings.

DESCRIPTION OF THE PREFERRED EMBODIMENTS

As an embodiment of the present invention, a process for interconnecting a lower level pattern and an upper level pattern by a metal film will be described with reference to the accompanying drawings.

Figure 1:
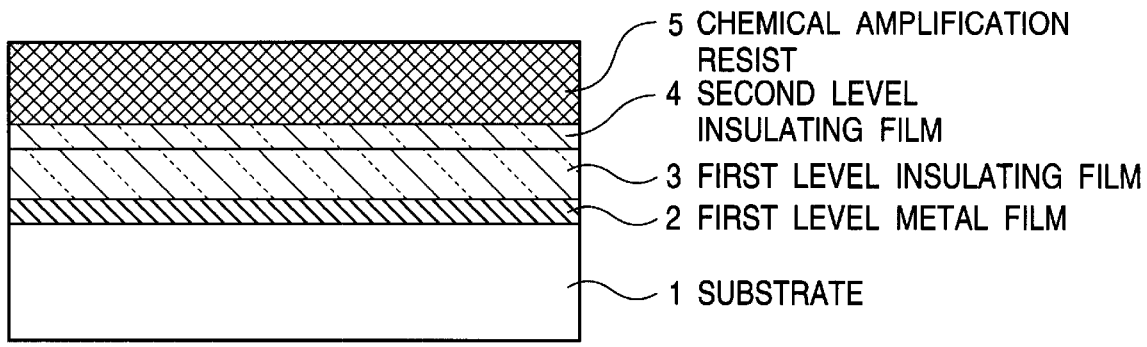
FIGS. 1 to 6 are diagrammatic section views of a semiconductor device, for illustrating an embodiment of the patterning method in accordance with the present invention in a semiconductor device fabricating process.

As shown in FIG. 1, on a surface of a lower level pattern (semiconductor substrate 1) where a desired pattern or structure (not shown) is formed, a metal film 2 for interconnecting with an upper level pattern is formed. This metal film 2 is formed of for example an aluminum film and has a thickness of about 700 nm. Then, for example a silicon oxide film is formed as an insulating film for separating between the lower level pattern (the substrate 1 plus the metal film 2) from the upper level pattern. This insulating film is formed in a double-layer structure. In order to ensure a satisfactory insulation, a dense silicon oxide film having a thickness of 500 nm to 800 nm is formed as a first level insulating film 3, and for planarization, a not-dense silicon oxide film is formed as a second level insulating film 4. For example, as the second level insulating film 4, an organic silica film having a thickness of 300 nm to 500 nm is formed by a spin coating.

Then, a contact hole is formed in the insulating film for interconnecting an upper level conducting film and a lower level conducting film. This contact hole is formed to penetrate through the insulating film and to reach the metal film 2 of the lower level pattern, by means of a lithography process. For this purpose, a chemical amplification resist is spin-coated on the double-layer insulating film (3+4) to form a chemical amplification resist layer 5.

Thereafter, the chemical amplification resist layer 5 is patterned by means of an exposure using a ultraviolet, an excimer laser light, an electron beam or another resist exposing means, and by means of a development. As a result, an opening 6 corresponding to a future contact hole is formed in the chemical amplification resist layer 5, as shown in FIG. 2.

Figure 2:
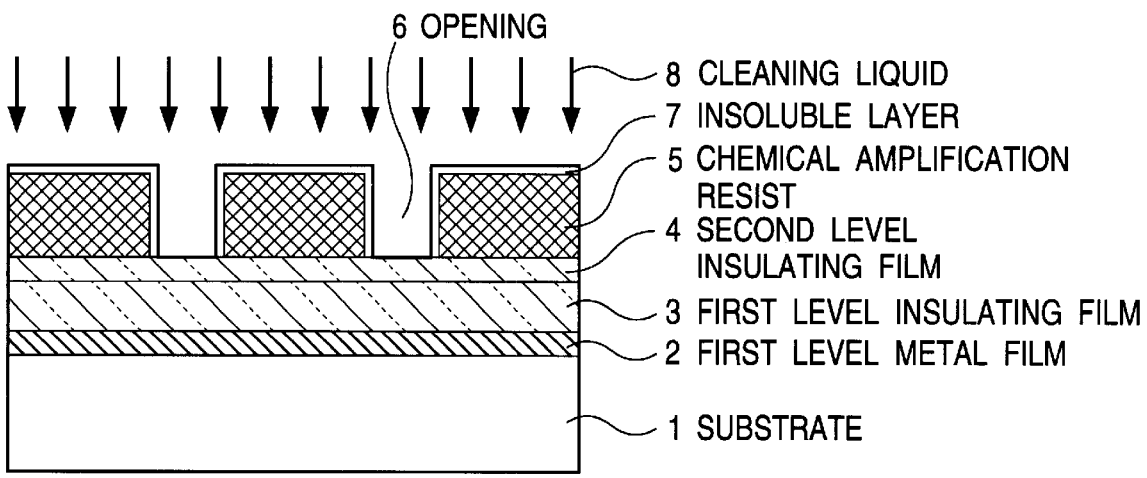

Furthermore, a surface treating agent is spin-coated on a surface of the patterned chemical amplification resist layer 5 to form an insoluble layer 7 on the surface of the patterned chemical amplification resist layer 5, as shown in FIG. 2. For example, a liquid obtained by dissolving a few % to few ten % of novolak resin into a solvent is used as the surface treating agent. Thereafter, the surface treating agent entering the inside of the opening 6 is removed by a cleaning liquid 8. An alkali solution or an organic solvent can be used as the cleaning liquid 8.

Figure 3:
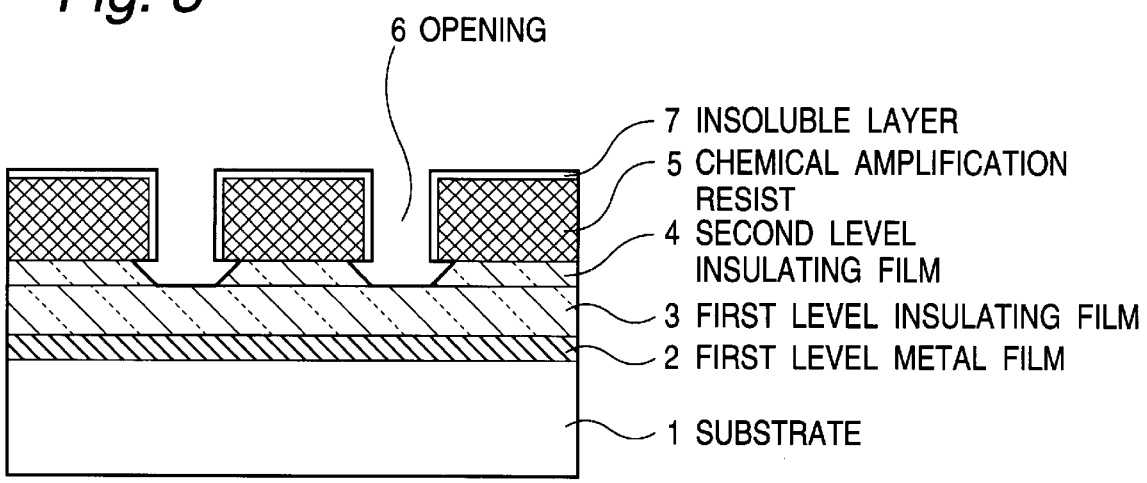

Thereafter, as shown in FIG. 3, the silicon oxide film of the second level insulating film 4 is wet-etched by a hydrofluoric acid (HE), using the patterned and surface-treated chemical amplification resist layer 5 as a mask. At this time, in some case, a treatment is conducted with a surface-active agent just before the wet etching using the hydrofluoric acid. After the wet etching, a baking is carried out at a temperature of not less than 100° C., in order to vaporize the moisture.

Figure 4:
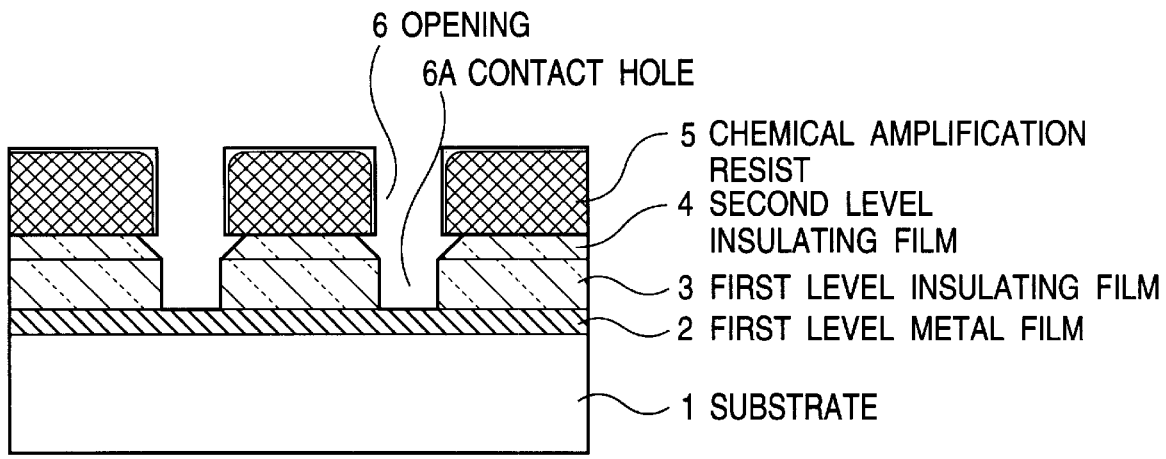
Figure 5:
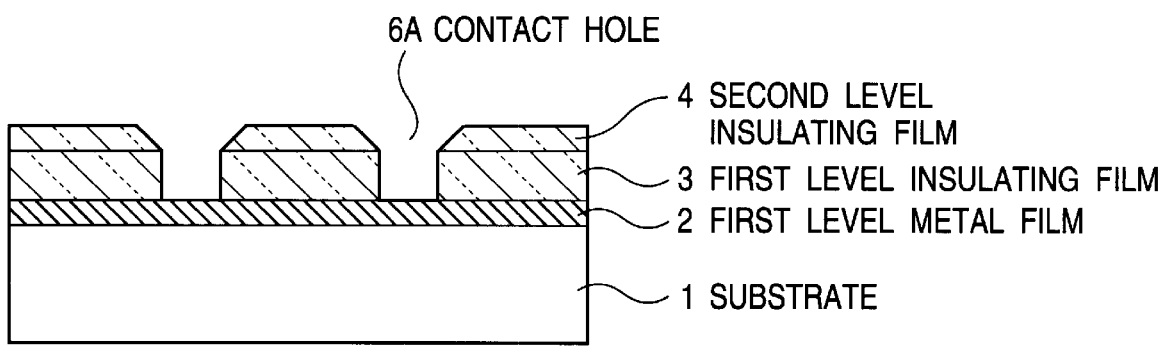

Then, as shown in FIG. 4, the first level insulating film 3 is etched by a dry etching using a plasma or the like. Furthermore, as shown in FIG. 5, the chemical amplification resist layer 5 is removed by a peeling means. Thus, a contact hole 6A penetrating through the double-layer insulating film is formed by a lithography process.

Figure 6:
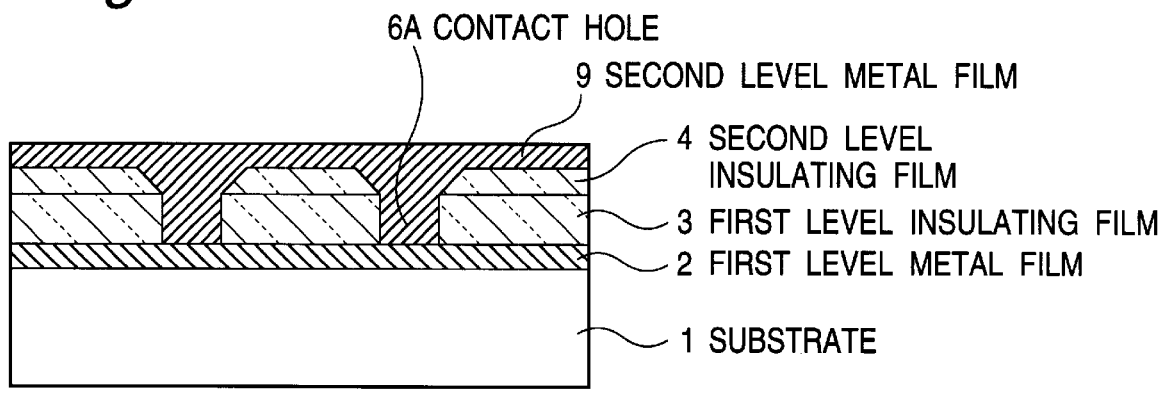

Succeedingly, as shown in FIG. 6, a second level metal film 9 is formed on the insulating film by use of a suitable means such as a CVD process or a sputtering. In this process, the second level metal film 9 is deposited within the contact hole 6A, so that the first level metal film 2 is electrically interconnected to the second level metal film 9 through the contact hole 6A.

Thus, by using the shown embodiment, the metal film 2 of the lower level pattern (substrate 1) in the semiconductor device and the upper level pattern (second level metal film 9) are interconnected by the contact hole 6A. On a surface portion of the lower level pattern (substrate 1) where necessary pattern and structure are formed, a metal film for interconnecting with the upper level pattern is formed, and on a surface portion where no interconnection is required, an insulating film such as a silicon oxide film is covered.

This insulating film is required to be thick in order to absorb steps of the underlying pattern. In the semiconductor device of this embodiment, the insulating film has a thickness of 800 nm to 1300 nm. However, the thickness of the insulating film varies dependently upon the structure and the kind of the semiconductor device. Since it is difficult to form this thick silicon oxide film at once, the thick silicon oxide film is formed by stacking two layers of silicon oxide. As mentioned above, the first level insulating film 3 is formed by forming the dense silicon oxide film to have a thickness of 500 nm to 800 nm, and the second level insulating film 4 is formed by forming a not-dense silicon oxide film, for example, an organic silica film to have a thickness of 300 nm to 500 nm, by a spin coating. The contact hole 6A is formed to penetrate through the double-layer insulating film so as to reach the lower level metal film 2.

This contact hole 6A is formed by the lithography process. A chemical amplification resist is spin-coated on the double-layer insulating film to form a chemical amplification resist layer. Then, the chemical amplification resist layer is selectively exposed by a ultraviolet, an excimer laser light, an electron beam or another resist exposing means, and then is developed, to form the opening 6 in the chemical amplification resist layer. Furthermore, an insoluble layer 7 is spin-coated on the surface of the patterned chemical amplification resist layer. This insoluble layer 7 is formed by spin-coating a liquid obtained by dissolving a few % to few ten % of novolak resin into a solvent (surface treating agent). Thereafter, the surface treating agent entering the inside of the opening 6 is removed by a cleaning liquid 8. An alkali solution or an organic solvent can be used as the cleaning liquid 8. The chemical amplification resist chemically bonds with the surface treating agent at a surface of the chemical amplification resist so that the surface condition of the chemical amplification resist changes (to an insoluble surface layer) to become insoluble to the cleaning liquid. On the other hand, a bonding between the surface treating agent entering the contact hole 6A and the oxide film at a bottom of the contact hole is a weak physical bonding, and therefore, the surface treating agent at the bottom of the contact hole can be washed away by the cleaning liquid 8.

Thereafter, the silicon oxide film of the second level insulating film 4 is wet-etched by a hydrofluoric acid (HF), using the patterned and surface-treated chemical amplification resist layer 5 as a mask. As mentioned above, at this time, in some case, a treatment is conducted with a surface-active agent just before the wet etching using the hydrofluoric acid. This makes it easy for the wet etching liquid to enter into the opening. In this wet etching, since the chemical amplification resist layer is protected from the wet etching liquid by the insoluble layer, no acid catalytic reaction occurs. Therefore, there occurs no deformation of the opening formed in the chemical amplification resist layer.

After the wet etching, a baking is carried out at a temperature of not less than 100° C., in order to vaporize the moisture. In this baking process, since the chemical amplification resist layer is protected from the wet etching liquid by the insoluble layer, no acid contacts the chemical amplification resist, nor is the diffusion of the acid promoted by the heat. Therefore, no acid catalytic reaction occurs, so that there occurs no deformation of the opening formed in the chemical amplification resist layer.

After the moisture is vaporized at some degree, the first level insulating film 3 is dry-etched by a plasma or the like, using the patterned and surface-treated chemical amplification resist layer 5 as a mask, again. Since no deformation has occurred in the opening formed in the chemical amplification resist layer, the contact hole 6A having the same shape and size as those of the opening 6 of the chemical amplification resist layer 5 is formed in the double-layer insulating film. Thereafter, the chemical amplification resist layer 5 is removed by a suitable peeling means.

Thus, the contact hole 6A is formed by the lithography process. Succeedingly, a second level metal film 9 is formed on the insulating film by use of a suitable means such as a CVD process or a sputtering. In this process, the second level metal film 9 is deposited within the contact hole 6A, so that the first level metal film 2 is electrically interconnected to the second level metal film 9 through the contact hole 6A.

In the above mentioned embodiment, the lower level metal film 2 is formed on the semiconductor substrate 1 as the lower level pattern. However, it would be a matter of course to persons skilled in the art that when the upper level metal film 9 can be contacted directly to a surface region of the semiconductor substrate 1 where the contact hole 6A is formed in the insulating film, the lower level metal film 2 can be omitted. It would also be a matter of course to persons skilled in the art that the lower level metal film 2 is formed on an interlayer insulator film, not in contact with the semiconductor substrate 1

Figure 7:
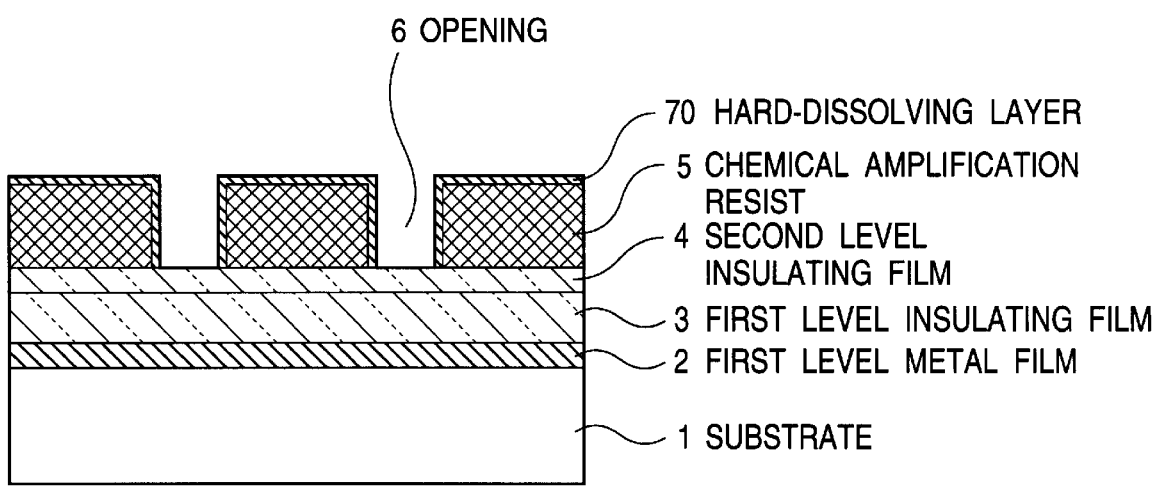
FIG. 7 is a diagrammatic section view similar to FIG. 2 but for illustrating another embodiment of the patterning method in accordance with the present invention in a semiconductor device fabricating process.

As another embodiment of the present invention, the nature of the surface of the chemical amplification resist layer can be modified by a surface treatment using a strong alkali liquid such as a developing liquid. With the surface treatment by the strong alkali liquid, low-molecular-weight components which exist at a surface of the chemical amplification resist layer and which are easily soluble to an alkali liquid, are firstly dissolved, so that high-molecular-weight components having a low solubility remain much at the surface of the chemical amplification resist layer. As a result, as shown in FIG. 7, a hard-dissolving layer 70 is formed on the surface of the chemical amplification resist layer. Therefore, the wet etching liquid becomes difficult to enter the chemical amplification resist layer. In FIG. 7, elements similar to those shown in FIG. 2 are given the same reference numbers, and explanation will be omitted.

As still another embodiment of the present invention, the nature of the surface of the chemical amplification resist layer can be modified by exposing the surface of the chemical amplification resist layer to plasma. The surface of the chemical amplification resist layer exposed to plasma changes in nature because of heat, ions and gas of the plasma, so as to make entering of the wet etching liquid difficult. As a result, as shown in FIG. 7, the hard-dissolving layer 70 is formed on the surface of the chemical amplification resist layer.

As a further embodiment of the present invention, the nature of the surface of the chemical amplification resist layer can be modified by irradiating onto the surface of the chemical amplification resist layer, a radiation different from a radiation of an exposure radiation source used for patterning the chemical amplification resist layer. Even in this case, as a result, as shown in FIG. 7, the hard-dissolving layer 70 is formed on the surface of the chemical amplification resist layer.

As mentioned above, if the patterning method in accordance with the present invention is used, it is possible to use the chemical amplification resist in the process for forming a contact hole used to interconnect the upper level conducting film and the lower level conducting film. Therefore, a fine pattern can be formed with a high throughput. This is because the pattern of the chemical amplification resist layer does not deform even if the wet etching is carried out using the chemical amplification resist as the mask. Accordingly, a good opening pattern having a desired shape can be obtained, and the yield of production and productivity of semiconductor devices can be elevated. The reason for this is that a film having the condition different from that of an ordinary resist (a surface protection film insoluble or hard-dissolving to the wet etching liquid) is formed on the surface of the chemical amplification resist layer, so that reaction between the wet etching liquid and the chemical amplification resist is prevented.

As mentioned hereinbefore, the chemical amplification resist is a high-resolution, high-sensitivity resist utilizing a catalytic reaction of an acid generated in a portion selectively exposed by an exposure light source, and on the other hand, a wet etching liquid used for patterning the insulating film is a strong acid. Therefore, if the chemical amplification resist is brought into contact with the wet etching liquid, the acid catalytic reaction occurs at a contact surface. As a result, the opening pattern formed in the chemical amplification resist layer becomes deformed. In particular, if a baking is conducted after the wet-etching, the acid contained in the wet etching liquid diffuses into the chemical amplification resist, and actively moves about (namely, diffuse in the chemical amplification resist), so that a heavy deformation of the pattern occurs, with the result that the opening formed in the chemical amplification resist layer is often filled up. In this condition, the upper level conducting film and the lower level conducting film cannot be interconnected. This problem has been overcome by the present invention.

The invention has thus been shown and described with reference to the specific embodiments. However, it should be noted that the present invention is in no way limited to the details of the illustrated structures but changes and modifications may be made within the scope of the appended claims.

What is claimed is:

1. A patterning method for a semiconductor device comprising:

forming a chemical amplification resist layer on an underlying film formed on a semiconductor substrate;

patterning said chemical amplification resist layer;

surface treating said patterned chemical amplification resist layer to form at a surface of said patterned chemical amplification resist layer a protective film which is insoluble or hard-dissolving to a wet-etching liquid, and wet-etching said underlying film using said wet-etching liquid and using said patterned chemical amplification resist layer as a mask.

2. The patterning method claimed in claim 1 wherein said surface treating comprises spin-coating said surface of said patterned chemical amplification resist layer with a liquid which comprises a novolak resin and a solvent.

3. The patterning method claimed in claim 1 wherein said surface treating comprises treating a surface of said patterned chemical amplification resist layer with an alkali liquid.

4. The patterning method claimed in claim 1 wherein said surface treating comprises exposing a surface of said patterned chemical amplification resist layer to plasma.

5. The patterning method claimed in claim 1 wherein said surface treating comprises irradiating, onto a surface of said patterned chemical amplification resist layer, a radiation different from a radiation of an exposure radiation source used for patterning said chemical amplification resist layer.

6. The patterning method claimed in claim 1, wherein said patterning said chemical amplification resist layer comprises forming an opening in said patterned chemical amplification resist layer, and wherein said underlying film is etched through said opening to form a contact hole.

7. The patterning method claimed in claim 6, further comprising:

peeling said patterned chemical amplification resist layer from said underlying film.

8. The patterning method claimed in claim 2, wherein said liquid comprises less than ten weight percent novolak resin.

9. The patterning method claimed in claim 1, wherein said underlying film comprises a first level insulating film and a second level insulating film having a combined thickness of between 800 and 1300 nm.

10. The patterning method claimed in claim 9, wherein said first level insulating film comprises silicon oxide having a thickness between 500 to 800 nm, and said second level insulating film comprises organic silica film having a thickness between 300 to 500 nm.

11. The patterning method claimed in claim 7, further comprising:

before forming said underlying film, forming a first metal film on said semiconductor substrate; and after removing said chemical amplification resist layer, forming a second metal film on said underlying layer and within said contact hole, so that said second metal film contacts said first metal film and is electrically connected to said first metal film through said contact hole.

12. The patterning method claimed in claim 6, wherein said contact hole has a diameter which is substantially equal to a diameter of an opening in said patterned chemical amplification resist layer.

13. The patterning method claimed in claim 1, wherein a wet-etching liquid comprises hydrofluoric acid.

14. The patterning method claimed in claim 6, further comprising:

cleaning an inside of said opening using a cleaning liquid to remove a surface treating agent.

15. The patterning method claimed in claim 14, wherein said cleaning liquid comprises one of an alkali solution and an organic solvent.

16. The patterning method claimed in claim 6, wherein during said wet-etching, said opening is not deformed.

17. The patterning method claimed in claim 6, wherein a wet-etching liquid is prevented from entering said chemical amplification resist layer.

18. The patterning method claimed in claim 7, further comprising: baking said semiconductor device at a temperature of 100° C. or higher.

19. A patterning method for a semiconductor device comprising:

forming a first metal layer on a semiconductor substrate;

forming an underlying film on said metal layer;

forming a chemical amplification resist layer on said underlying film;

patterning said chemical amplification resist layer to form openings;

surface treating said chemical amplification resist layer to increase a wet etching resistance of said chemical amplification resist layer;

wet-etching said underlying film through said openings to form contact holes in said underlying film;

removing said chemical amplification resist layer; and forming a second metal layer on said underlying film and in said contact holes so that said second metal layer contacts said first metal layer.

* * * * *